(12) United States Patent
Sudo

(10) Patent No.: US 8,168,520 B2
(45) Date of Patent: May 1, 2012

(54) METHOD OF MANUFACTURING SEMICONDUCTOR DEVICE

(75) Inventor: Gaku Sudo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 213 days.

(21) Appl. No.: 12/470,094

(22) Filed: May 21, 2009

(65) Prior Publication Data

US 2010/0124815 A1 May 20, 2010

(30) Foreign Application Priority Data

Nov. 14, 2008 (JP) ................................ 2008-292206

(51) Int. Cl.
*H01L 21/3205* (2006.01)
*H01L 21/4763* (2006.01)

(52) U.S. Cl. . 438/587; 438/702; 438/703; 257/E21.029; 257/E21.305

(58) Field of Classification Search .................. 438/283, 438/587, 694, 952, 157, 176, 195, 588, 702, 438/FOR. 118, FOR. 393, 689, 699, 700, 438/703, 710, 714, 721, 734; 257/E21.621, 257/E21.023, E21.034, E21.035, E21.029, 257/E21.036, E21.233, E21.294, E21.305, 257/E21.652, E21.635
See application file for complete search history.

(56) References Cited

U.S. PATENT DOCUMENTS

| 5,858,580 | A | 1/1999 | Wang et al. | |
|---|---|---|---|---|
| 6,042,998 | A | 3/2000 | Brueck et al. | |
| 6,277,706 | B1 * | 8/2001 | Ishikawa | 438/424 |
| 6,337,269 | B1 * | 1/2002 | Huang et al. | 438/618 |
| 6,660,613 | B2 * | 12/2003 | Kim et al. | 438/424 |
| 7,535,051 | B2 * | 5/2009 | Kim et al. | 257/315 |
| 2007/0072131 | A1 | 3/2007 | Oguma | |
| 2008/0305623 | A1 * | 12/2008 | Zhuang et al. | 438/587 |

OTHER PUBLICATIONS

Morimoto et al.; "Layout-Design Methodology of 0.246-$\mu m^2$-Embedded 6T-SRAM for 45-nm High-Performance System LSIs", Symposium on VLSI Technology Digest of Technical Papers, pp. 28-29, (2007).

* cited by examiner

*Primary Examiner* — Julio J Maldonado
*Assistant Examiner* — Quovaunda V Jefferson
(74) *Attorney, Agent, or Firm* — Finnegan, Henderson, Farabow, Garrett & Dunner, L.L.P.

(57) ABSTRACT

A method of manufacturing a semiconductor device according to an embodiment of the present invention forms at least one pair of gate electrodes having end portions opposed to each other across a gap. The method includes forming a gate insulator and a gate electrode layer on a substrate in order, forming a first anti-reflection coating and a first resist on the gate electrode layer in order, exposing and developing the first resist, etching the gate electrode layer, using the first resist or the first anti-reflection coating as a mask, to remove the gate electrode layer from a region for forming the gap, thereby forming a hole penetrating the gate electrode layer, forming a second anti-reflection coating and a second resist on the gate electrode layer where the hole has been formed, in order, exposing and developing the second resist, and etching the gate electrode layer, using the second resist or the second anti-reflection coating as a mask, to form, from the gate electrode layer, the at least one pair of gate electrodes having the end portions opposed to each other across the gap.

18 Claims, 13 Drawing Sheets

METHOD OF MANUFACTURING SEMICONDUCTOR DEVICE

CROSS REFERENCE TO RELATED APPLICATION

This application is based upon and claims the benefit of priority from the prior Japanese Patent Application No. 2008-292206, filed on Nov. 14, 2008, the entire contents of which are incorporated herein by reference.

BACKGROUND OF THE INVENTION

1. Field of the Invention

The present invention relates to a method of manufacturing a semiconductor device, for example, to the method which is required to provide a gate length smaller than an exposure limit, and to fabricate a gate butt portion.

2. Background Art

In the semiconductor industry, employment of various processing techniques has led to smaller design rules with each passing year. For example, a gate length smaller than an exposure limit can be provided by performing exposure at an exposure limit and then reducing the gate length when a gate etching is performed (hereinafter referred to as "trimming"). Further, use of a Levenson mask enables to form a pattern finer than a conventional pattern, using light having a conventionally used wavelength (see U.S. Pat. No. 5,858,580).

However, the trimming causes problems in forming opposed end portions of gate electrodes of adjacent SRAM cells, which are called "gate butt portions", as shown in US 2007/0072131 A1. In fact, the distance between the gate butt portions becomes larger due to the trimming. Therefore, it is impossible to concurrently realize both of providing a gate length smaller than an exposure limit and fabricating the gate butt portions by one exposure. Therefore, "double exposure", in which a gate etching is performed by two exposures, is receiving increasing attention (see U.S. Pat. No. 6,042,998).

However, the double exposure raises such problems as an increase of a manufacturing cost of LSIs due to an increase of the number of steps, an increase of the number of times of post-processing, and a difficulty in applying BARC (Bottom Anti-Reflection Coating) for the second exposure. The BARC is an anti-reflection coating formed as a sublayer of a resist. Therefore, in the case where the double exposure is employed, it is desired that these problems or a problem caused by these problems should be suppressed.

SUMMARY OF THE INVENTION

An aspect of the present invention is, for example, a method of manufacturing a semiconductor device, for forming at least one pair of gate electrodes having end portions opposed to each other across a gap, the method including forming a gate insulator and a gate electrode layer on a substrate in order, forming a first anti-reflection coating and a first resist on the gate electrode layer in order, exposing and developing the first resist, etching the gate electrode layer, using the first resist or the first anti-reflection coating as a mask, to remove the gate electrode layer from a region for forming the gap, thereby forming a hole penetrating the gate electrode layer, forming a second anti-reflection coating and a second resist on the gate electrode layer where the hole has been formed, in order, exposing and developing the second resist, and etching the gate electrode layer, using the second resist or the second anti-reflection coating as a mask, to form, from the gate electrode layer, the at least one pair of gate electrodes having the end portions opposed to each other across the gap.

Another aspect of the present invention is, for example, a method of manufacturing a semiconductor device, for forming at least one pair of gate electrodes having end portions opposed to each other across a gap, the method including forming a gate insulator and a gate electrode layer on a substrate in order, forming a first anti-reflection coating and a first resist on the gate electrode layer in order, exposing and developing the first resist, etching the gate electrode layer, using the first resist or the first anti-reflection coating as a mask, to remove the gate electrode layer from a region for forming the gap, thereby forming a hole penetrating the gate electrode layer, embedding an insulating layer in the hole, forming a second anti-reflection coating and a second resist on the gate electrode layer where the insulating layer has been embedded, in order, exposing and developing the second resist, and etching the gate electrode layer, using the second resist or the second anti-reflection coating as a mask, to form, from the gate electrode layer, the at least one pair of gate electrodes having the end portions opposed to each other across the gap.

DESCRIPTION OF THE EMBODIMENTS

Embodiments of the present invention will be described with reference to the drawings.
(First Embodiment)

Figure 1:
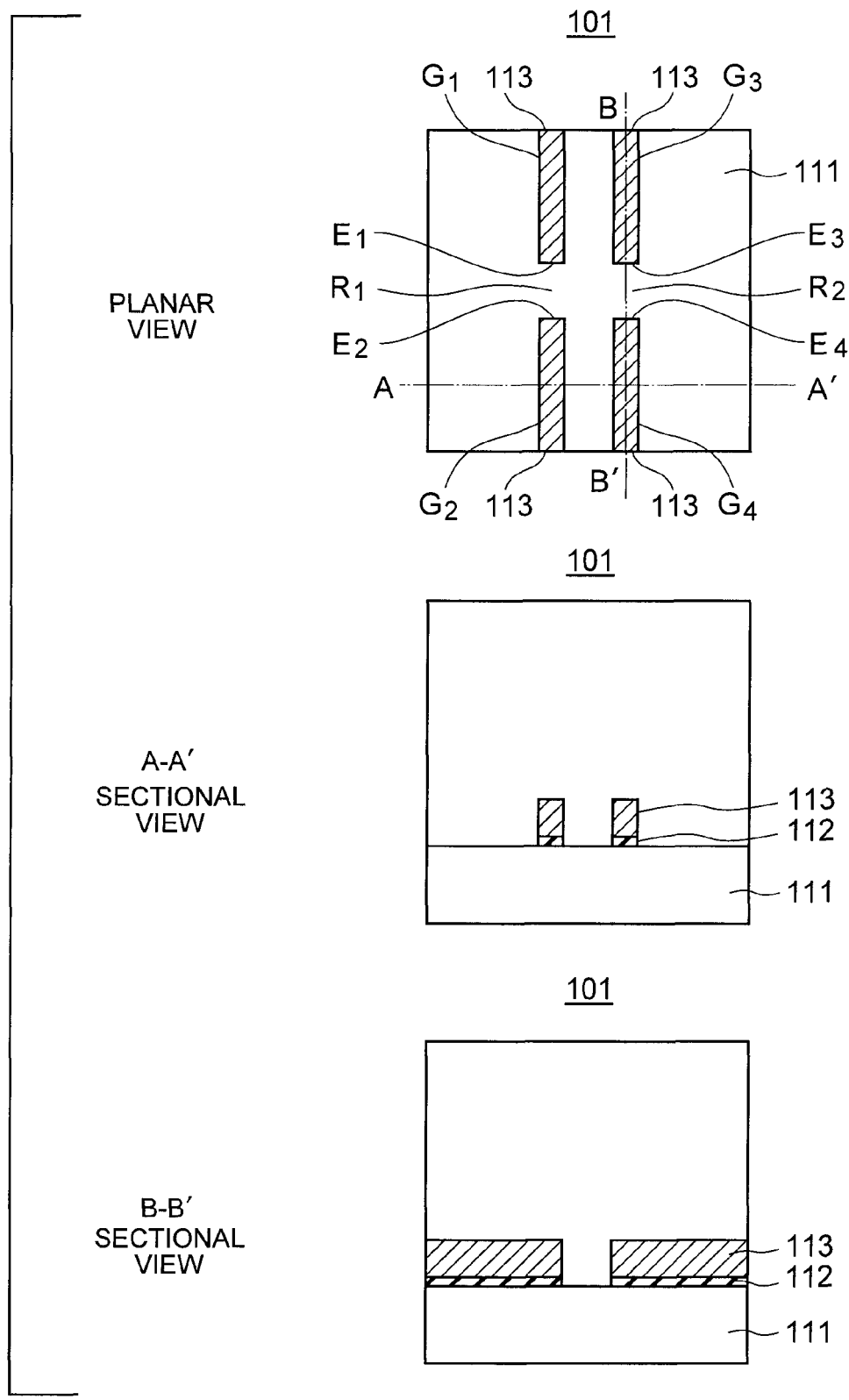
FIG. 1 shows a planar view and side sectional views illustrating a method of manufacturing a semiconductor device according to a first embodiment.

FIG. 1 shows a planar view and side sectional views illustrating a method of manufacturing a semiconductor device

101 according to a first embodiment. Specifically, FIG. 1 shows a planar view on the top, an A-A' sectional view in the middle, and a B-B' sectional view at the bottom. The planar view in FIG. 1 shows positions of the A-A' section and the B-B' section.

The semiconductor device 101 of FIG. 1 includes a substrate 111, gate insulators 112, and gate electrodes 113. The gate insulators 112 are formed on the substrate 111, and the gate electrodes 113 are formed on the gate insulators 112.

FIG. 1 shows a pair of gate electrodes 113 indicated by $G_1$ and $G_2$, and another pair of gate electrodes 113 indicated by $G_3$ and $G_4$. The gate electrodes $G_1$ and $G_2$ have end portions $E_1$ and $E_2$ respectively, which are opposed to each other across a gap $R_1$. Similarly, the gate electrodes $G_3$ and $G_4$ have end portions $E_3$ and $E_4$ respectively, which are opposed to each other across a gap $R_2$. The end portions $E_1$ to $E_4$ are positioned at the tips of the gate electrodes $G_1$ to $G_4$ respectively, each having a shape of a strip. An end portion opposed to another end portion across a gap, as each of the end portions $E_1$ to $E_4$, is called "gate butt portion".

The manufacturing method of the present embodiment provides gate electrodes 113 as shown in FIG. 1, more specifically, at least one pair of gate electrodes 113 having end portions opposed to each other across a gap. The manufacturing method of the present embodiment may provide one pair of gate electrodes 113, or two or more pairs of gate electrodes 113. A flow of the manufacturing method of the present embodiment will be described with reference to FIG. 2.

Figure 2:
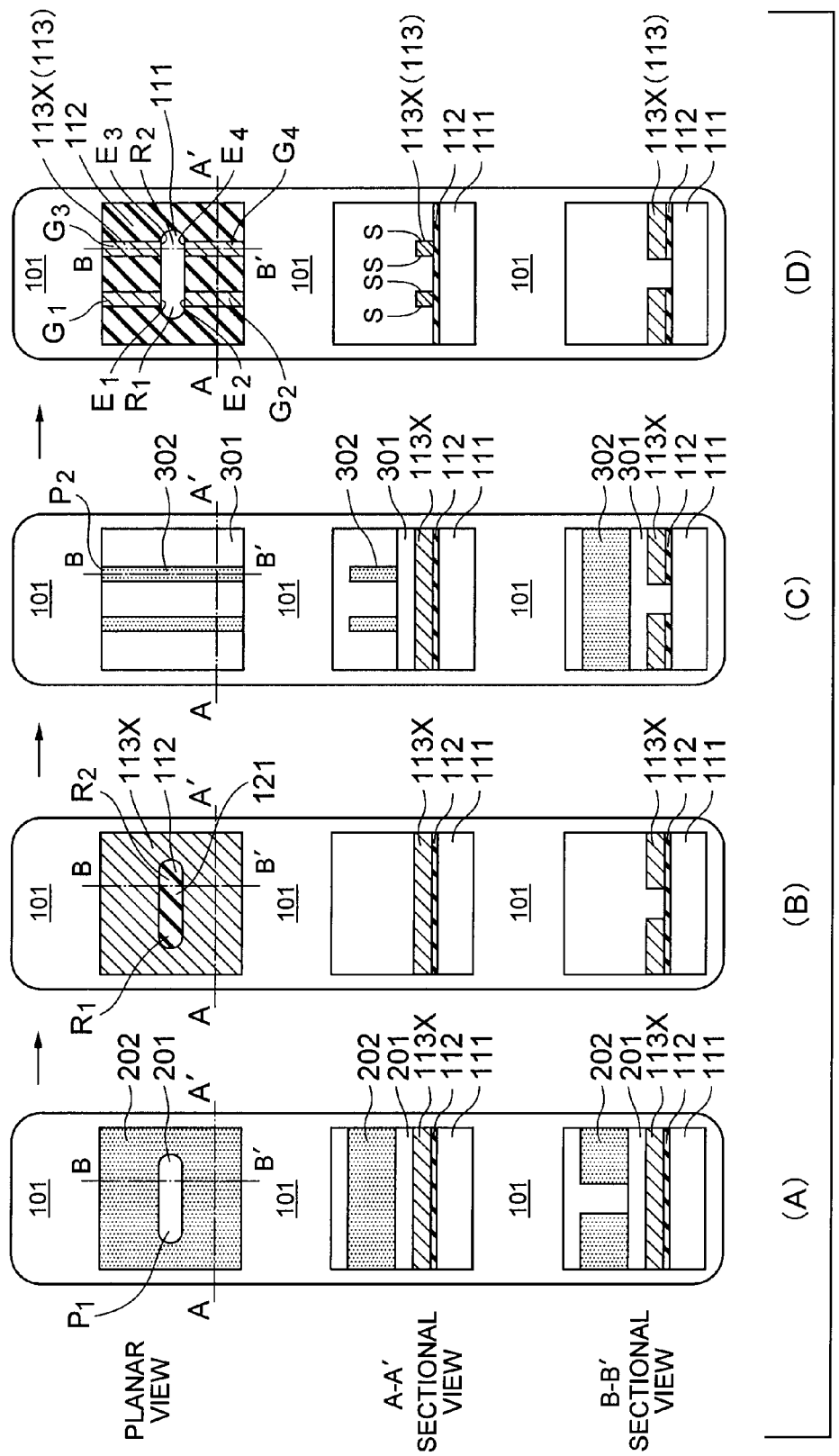
FIG. 2 is a step diagram illustrating the method of manufacturing the semiconductor device according to the first embodiment.

FIG. 2 is a step diagram illustrating the method of manufacturing the semiconductor device 101 according to the first embodiment. In FIG. 2, steps of the manufacturing method are illustrated in FIGS. 2(A) to 2(D). The steps illustrated in FIGS. 2(A) to 2(D) are shown in the order of procedure of the manufacturing method. Also, similar to FIG. 1, each of FIGS. 2(A) to 2(D) shows a planar view on the top, an A-A' sectional view in the middle, and a B-B' sectional view at the bottom.

First, as shown in FIG. 2(A), a gate insulator 112 is formed on a substrate 111. The substrate 111, here, is a silicon substrate. The substrate 111 may be an SOI (Silicon On Insulator) substrate. The gate insulator 112, here, is a silicon oxide layer. Then, as shown in FIG. 2(A), a gate electrode layer 113X is formed on the gate insulator 112. The gate electrode layer 113X, here, is a polysilicon layer.

Then, as shown in FIG. 2(A), a first BARC 201 is formed on the gate electrode layer 113X. The first BARC 201 is an anti-reflection coating formed as a sublayer of a resist, and is an example of a first anti-reflection coating of the present invention. Then, as shown in FIG. 2(A), a first resist 202 is formed on the first BARC 201. As will be described later, the first resist 202 is used for fabricating gate butt portions.

Then, the first resist 202 is exposed and developed. As a result, as shown in FIG. 2(A), a pattern $P_1$ for fabricating the gate butt portions is transferred to the first resist 202.

Then, the first BARC 201 is etched using the first resist 202 as a mask. Then, the gate electrode layer 113X is etched using the first resist 202 or the first BARC 201 as a mask. As a result, as shown in FIG. 2(B), the gate electrode layer 113X is removed from a region where gaps $R_1$ and $R_2$ are to be formed, and a hole 121 penetrating the gate electrode layer 113X is formed in the region. A part of the cross-section of the gate electrode layer 113X exposed in the hole 121 is to become gate butt portions. Then, after the gate electrode layer 113X is etched, the gate electrode layer 113X is subjected to post-processing. As a result of the post-processing, the gate insulator 112 in the hole 121 is removed.

The first resist 202 and the first BARC 201 are removed after the gate electrode layer 113X has been etched. However, the first resist 202 becomes thinner as the gate electrode layer 113X is etched. Therefore, the first resist 202 may disappear before the etching of the gate electrode layer 113X is completed. In this case, the gate electrode layer 113X is etched using the first resist 202 as a mask before the first resist 202 disappears, and after disappearance of the first resist 202, the gate electrode layer 113X is etched using the first BARC 201 as a mask. In the present embodiment, the first resist 202 and the first BARC 201 are both made up of organic layers.

At the step shown in FIG. 2(B), the gate electrode layer 113X is etched by RIE (Reactive Ion Etching). In the case where the gate electrode layer 113X is etched by RIE, reactive by-product is attached to the gate electrode 113X after the etching. The reactive by-product is removed in the above post-processing. The first resist 202 and the first BARC 201 are also removed in the post-processing.

Then, as shown in FIG. 2(C), a second BARC 301 is formed on the gate electrode layer 113X where the hole 121 has been formed. The second BARC 301 is an anti-reflection coating formed as a sublayer of a resist, and is an example of a second anti-reaction layer of the present invention. Then, as shown in FIG. 2(C), a second resist 302 is formed on the second BARC 301. As will be described later, the second resist 302 is used for fabricating MOS gates.

Then, the second resist 302 is exposed and developed. As a result, as shown in FIG. 2(C), a pattern $P_2$ for fabricating the MOS gates is transferred to the second resist 302.

Then, the second BARC 301 is etched using the second resist 302 as a mask. Then, the gate electrode layer 113X is etched using the second resist 302 or the second BARC 301 as a mask. As a result, as shown in FIG. 2(D), two pairs of gate electrodes 113 are formed from the gate electrode layer 113X. More specifically, there are formed a pair of gate electrodes $G_1$ and $G_2$ having end portions $E_1$ and $E_2$ respectively, which are opposed to each other across a gap $R_1$, and another pair of gate electrodes $G_3$ and $G_4$ having end portions $E_3$ and $E_4$ respectively, which are opposed to each other across a gap $R_2$. The cross-sections of the end portions $E_1$ to $E_4$ are a part of the cross-section of the gate electrode layer 113X, which has been exposed in the hole 121 at the step of FIG. 2(B). Then, post-processing is performed after processing the gate electrode layer 113X. As a result, the exposed gate insulator 112 is removed, and the gate structure shown in FIG. 1 is realized.

The second resist 302 and the second BARC 301 are removed after etching the gate electrode layer 113X. This is the same as in the case of the first resist 202 and the first BARC 201. In the present embodiment, the second resist 302 and the second BARC 301 are both made of organic layers.

At the step shown in FIG. 2(D), the gate electrode layer 113X is etched by RIE, and reactive by-product is attached to the gate electrode 113X after the etching. The reactive by-product is removed in the above post-processing. The second resist 302 and the second BARC 301 are also removed in the post-processing.

Hereinafter, the present embodiment is compared with first and second comparative examples. In the present embodiment, the gate butt portions are fabricated before fabricating the MOS gates, whereas, in the first and second comparative examples, gate butt portions are fabricated after fabricating MOS gates. Further, in the first comparative example, a gate etching is performed using a hard mask, unlike the present embodiment, while, in the second comparative example, a gate etching is performed without using a hard mask, similar to the present embodiment.

Figure 3:
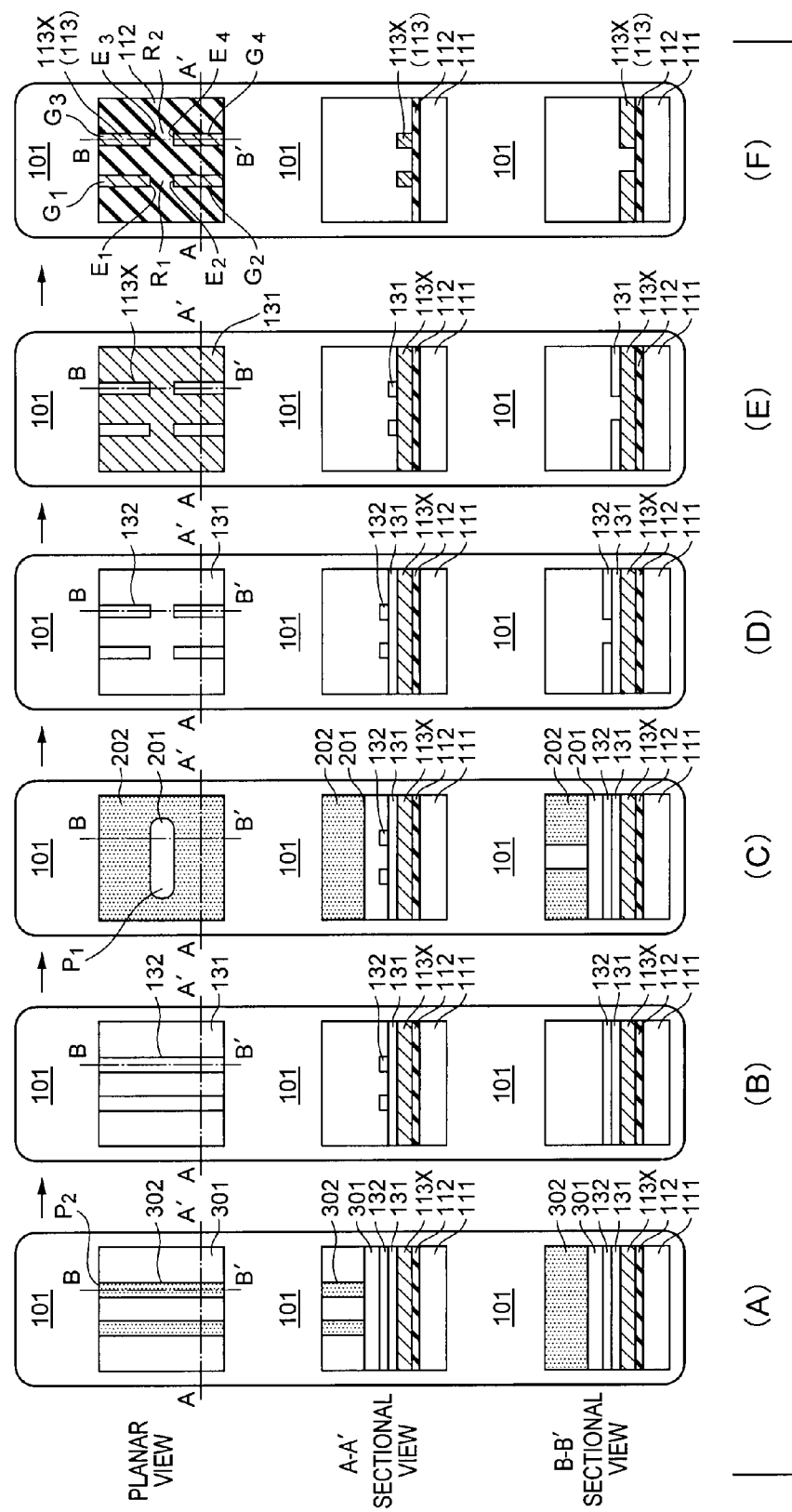
FIG. 3 is a step diagram illustrating a method of manufacturing a semiconductor device according to a first comparative example.

FIG. 3 is a step diagram illustrating a method of manufacturing a semiconductor device 101 according to a first comparative example.

In the first comparative example, as shown in FIG. 3(A), a gate insulator 112, a gate electrode layer 113X, a hard mask layer 131, and a transfer layer 132 are formed in this order on a substrate 111.

Then, as shown in FIG. 3(A), a second BARC 301 and a second resist 302 for fabricating MOS gates are sequentially formed on the transfer layer 132. Then, the second resist 302 is exposed and developed to transfer a pattern $P_2$ for fabricating the MOS gates, to the second resist 302. Then, the transfer layer 132 is etched using the second resist 302 or the second BARC 301 as a mask. As a result, as shown in FIG. 3(B), the pattern $P_2$ is transferred to the transfer layer 132. Then, after the transfer layer 132 is etched, the transfer layer 132 is subjected to post-processing.

Then, as shown in FIG. 3(C), a first BARC 201 and a first resist 202 for fabricating gate butt portions are sequentially formed on the transfer layer 132. Then, the first resist 202 is exposed and developed to transfer a pattern $P_1$ for fabricating the gate butt portions, to the first resist 202. Then, the transfer layer 132 is etched using the first resist 202 or the first BARC 201 as a mask. As a result, as shown in FIG. 3(D), the pattern $P_1$ is transferred to the transfer layer 132. Then, after the transfer layer 132 is etched, the transfer layer 132 is subjected to post-processing.

Then, the hard mask layer 131 is etched using the transfer layer 132 as a mask. As a result, as shown in FIG. 3(E), the pattern of the transfer layer 132 is transferred to the hard mask layer 131. Then, the gate electrode layer 113X is etched using the hard mask layer 131 as a mask. As a result, as shown in FIG. 3(F), two pairs of gate electrodes 113 are formed from the gate electrode layer 113X. Then, after the gate electrode layer 113X is etched, the gate electrode layer 113X is subjected to post-processing.

In this way, a gate etching by double exposure is performed in the first comparative example, similar to the present embodiment. However, use of the hard mask in the gate etching unavoidably increases the number of steps in the first comparative example.

On the other hand, in the present embodiment, the gate etching is performed without using a hard mask. Therefore, the number of steps is comparatively reduced in the present embodiment in spite of the fact that the gate etching is performed by double exposure. In this way, the present embodiment can suppress an increase of the number of steps, to thereby suppress an increase of a manufacturing cost of the semiconductor device 101, caused by the employment of the double exposure.

Figure 4:
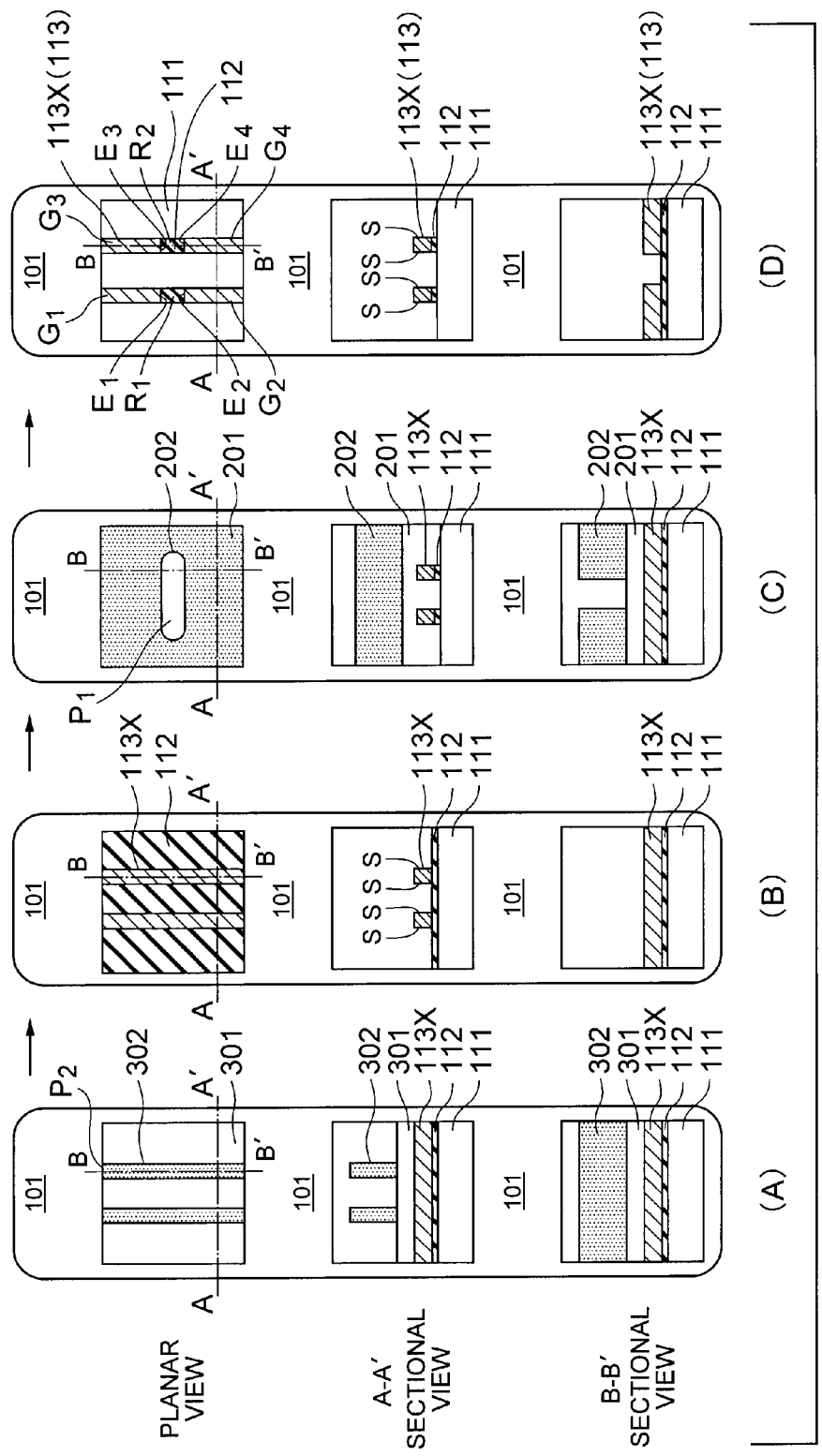
FIG. 4 is a step diagram illustrating a method of manufacturing a semiconductor device according to a second comparative example.

FIG. 4 is a step diagram illustrating a method of manufacturing a semiconductor device 101 according to a second comparative example.

In the second comparative example, as shown in FIG. 4(A), a gate insulator 112 and a gate electrode layer 113X are sequentially formed on a substrate 111.

Then, as shown in FIG. 4(A), a second BARC 301 and a second resist 302 for fabricating MOS gates are sequentially formed on the gate electrode layer 113X. Then, the second resist 302 is exposed and developed to transfer a pattern $P_2$ for fabricating the MOS gates, to the second resist 302. Then, the gate electrode layer 113X is etched using the second resist 302 or the second BARC 301 as a mask. As a result, as shown in FIG. 4(B), the gate electrode layer 113X is etched into strip shapes. Then, after the gate electrode layer 113X is etched, the gate electrode layer 113X is subjected to post-processing.

Then, as shown in FIG. 4(C), a first BARC 201 and a first resist 202 for fabricating gate butt portions are sequentially formed on the gate electrode layer 113X which have been etched into strip shapes. Then, the first resist 202 is exposed and developed to transfer a pattern $P_1$ for fabricating the gate butt portions, to the first resist 202. Then, the gate electrode layer 113X is etched using the first resist 202 or the first BARC 201 as a mask. As a result, as shown in FIG. 4(D), two pairs of gate electrodes 113 are formed from the gate electrode layer 113X. Then, after the gate electrode layer 113X is etched, the gate electrode layer 113X is subjected to post-processing.

In this way, a gate etching is performed by double exposure in the second comparative example, similar to the present embodiment. Further, the gate etching is performed without using a hard mask, similar to the present embodiment. However, since the gate butt portions are fabricated after fabricating the MOS gates in the second comparative example, the second comparative example raises such problems as described below.

In FIG. 4, each of side surfaces of the gate electrodes 113 is indicated by "S". In particular, the side surfaces "S" are shown in the A-A' sectional views in FIGS. 4(B) and 4(D). Since the MOS gates are fabricated before fabricating the gate butt portions in the second comparative example, the side surfaces "S" are formed at the stage shown in FIG. 4(B). Therefore, in the second comparative example, the side surfaces "S" are subjected to post-processing twice, i.e. the post-processing at the stage shown in FIG. 4(B) and the post-processing at the stage shown in FIG. 4(D). Accordingly, there is a concern that the two post-processings may adversely effect the gate electrodes 113 used as MOSFETs (i.e., the gate electrodes 113 in an element region).

Further, the two post-processings of the second comparative example may be problematic in the case where products (semiconductor devices 101) of the same generation include both of those products which need to fabricate gate butt portions of gate electrode 113, and of those products which do not need to fabricate gate butt portions of gate electrode 113. This is because the side surfaces "S" of the former gate electrodes 113 are subjected to post-processing twice, while the side surfaces "S" of the latter gate electrodes 113 are subjected to post-processing only once, whereby the characteristics of the gate electrodes 113 may be differentiated between the former and the latter.

On the other hand, in the present embodiment, the MOS gates are fabricated after the gate butt portions have been fabricated. Accordingly, the side surfaces "S" are formed at the stage shown in FIG. 2(D) in the present embodiment. This means that, in the present embodiment, the side surfaces "S" are subjected to post-processing only once at the stage shown in FIG. 2(D). In this way, the present embodiment can suppress an increase of an adverse effect of post-processing, caused by the employment of the double exposure.

Further, the present embodiment is advantageous in the case where products (semiconductor devices 101) of the same generation include both of those products which need to fabricate gate butt portions of gate electrodes 113, and of those products which do not need to fabricate gate butt portions of gate electrodes 113. This is because, the side surfaces "S" of the gate electrodes 113 are all subjected to post-processing only once.

A relationship between the gate electrodes 113 used as MOSFETs and the post-processing will be described below.

Figure 5:
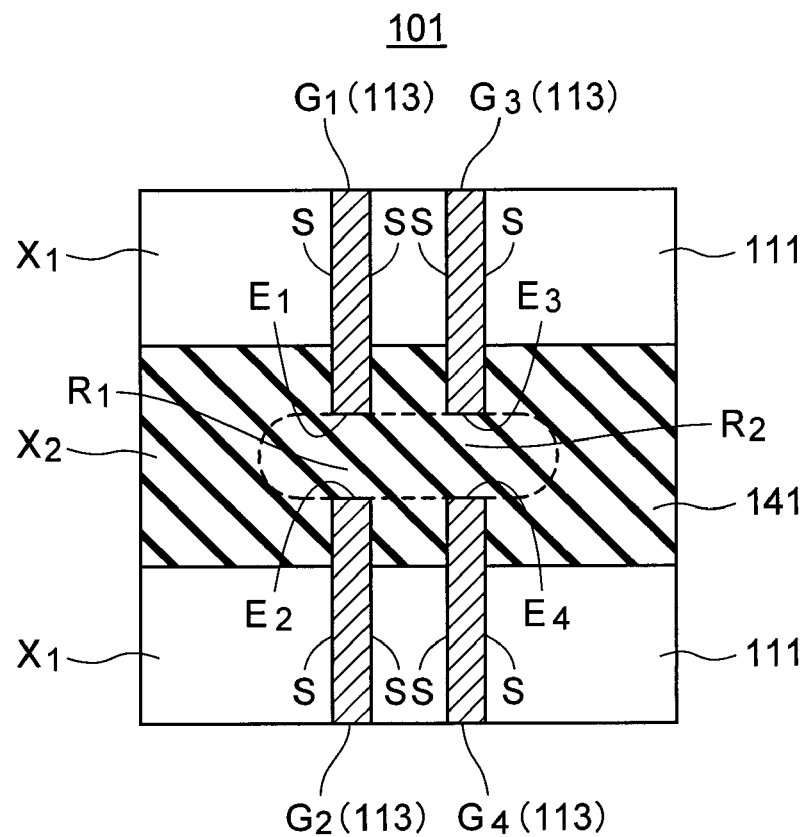
FIG. 5 shows a planar view for explaining an isolation layer.

In the present embodiment, as shown in a planar view of FIG. 5, an isolation layer 141 is formed on the substrate 111 prior to the step shown in FIG. 2(A). The isolation layer 141 is formed by forming an isolation trench on the substrate 111 and embedding an isolation material in the trench. The isolation layer 141, here, is made up of a silicon oxide layer. At the step shown in FIG. 2(A), the gate insulator 112 and the gate electrode layer 113X are sequentially formed on the substrate 111 on which the isolation layer 141 has been formed.

In the present embodiment, an element region $X_i$ and an isolation region $X_2$ are formed on the substrate 111 by forming the isolation layer 141 on the substrate 111. The element region $X_1$ is an area where no isolation layer 141 is formed on the surface of the substrate 111. On the other hand, the isolation region $X_2$ is an area where the isolation layer 141 is formed on the surface of the substrate 111.

In the present embodiment, as shown in FIG. 5, the hole 121 for fabricating the gate butt portions (hereinafter referred to as "gate butt hole 121") is formed in the isolation region $X_2$. This configuration has such an advantage that the gate electrodes 113 used as MOSFETs, i.e., the gate electrodes 113 in the element region $X_1$, are not exposed as the end portions indicated by $E_1$ to $E_4$. In the present embodiment, although the side surfaces "S" of the gate electrodes 113 are subjected to post-processing only once, the end portions $E_1$ to $E_4$ of the gate electrodes are subjected to post-processing twice. Therefore, in the present embodiment, the gate butt hole 121 is formed in the isolation region $X_2$, so that the gate electrodes 113 used as MOSFETs can be prevented from being adversely effected by the two post-processings of the end portions.

It should be noted that, for simplifying explanation, FIGS. 1 to 4 omit illustration of the isolation layer 141.

Hereinafter, comparison between the present embodiment and the second comparative example is continued.

In the second comparative example, as shown in FIG. 4(C), the first BARC 201 is applied on the gate electrode layer 113X which has been etched into strip shapes. Therefore, in the second comparative example, the thickness of the first BARC 201 is required to be sufficiently large in its entirety so that the gate electrode layer 113X is fully buried under the first BARC 201. For this reason, the second comparative example has a drawback of causing difficulty in applying the first BARC 201.

On the other hand, in the present embodiment, as shown in FIG. 2(C), the second BARC 301 is applied on the gate electrode layer 113X where the gate butt hole 121 has been formed. In the present embodiment, since the area of the hole 121 is comparatively small, it is not necessary to make the thickness of the second BARC 301 as large as that of the first BARC 201 of the second comparative example. Therefore, the second BARC 301 can be comparatively easily applied in the present embodiment. In this way, according to the present embodiment, the application of the BARC for the second exposure can be comparatively readily carried out.

Details of the gate butt hole 121 will be described below.

Figure 6:
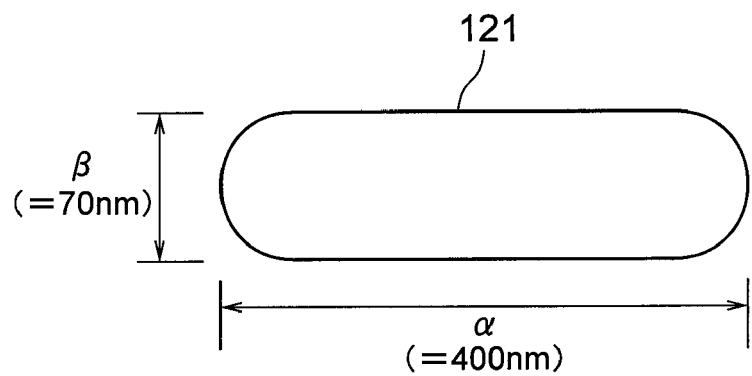
FIG. 6 shows a planar view for explaining a gate butt hole.

FIG. 6 shows a planar view for explaining the gate butt hole 121. As shown in FIG. 6, the hole 121 has an elliptical shape made up of semicircles and straight lines. In FIG. 6, the length of the major axis of the hole 121 is indicated by "$\alpha$", and the length of the minor axis of the hole 121 is indicated by "$\beta$". The size of the hole 121, i.e., the values of "$\alpha$" and "$\beta$", has been reduced yearly in accordance with design rule reduction. In the present embodiment, the length "$\alpha$" is 400 nm, and the length "$\beta$" is 70 nm.

As described above, in the present embodiment, the second BARC 301 is applied on the gate electrode 113X where the hole 121 has been formed. Therefore, as shown in a side sectional view of FIG. 7, a recess "Q" is caused in the second BARC 301 on and around the hole 121. In other words, in the present embodiment, the thickness of the second BARC 301 becomes unavoidably small on and around the hole 121. Small thickness of the second BARC 301 around the hole 121 may possibly hinder appropriate exposure.

However, the hole 121 of adequately small size may be expected to suppress the reduction in the thickness of the BARC around the hole 121 and to avoid the above-mentioned disadvantage in the exposure. Meanwhile, as mentioned above, the size of the hole 121 has been reduced yearly in accordance with design rule reduction. Under such circumstances, the inventors have made diligent study and have found that the recent design rules, i.e., $\alpha$=400 nm and $\beta$=70 nm, can adequately suppress the reduction in the thickness of the BARC around the hole 121 and can avoid the above-mentioned disadvantage in the exposure. Therefore, in the present embodiment, the manufacturing method shown in FIG. 2 can be performed while avoiding the above-mentioned disadvantage in the exposure.

Figure 7:
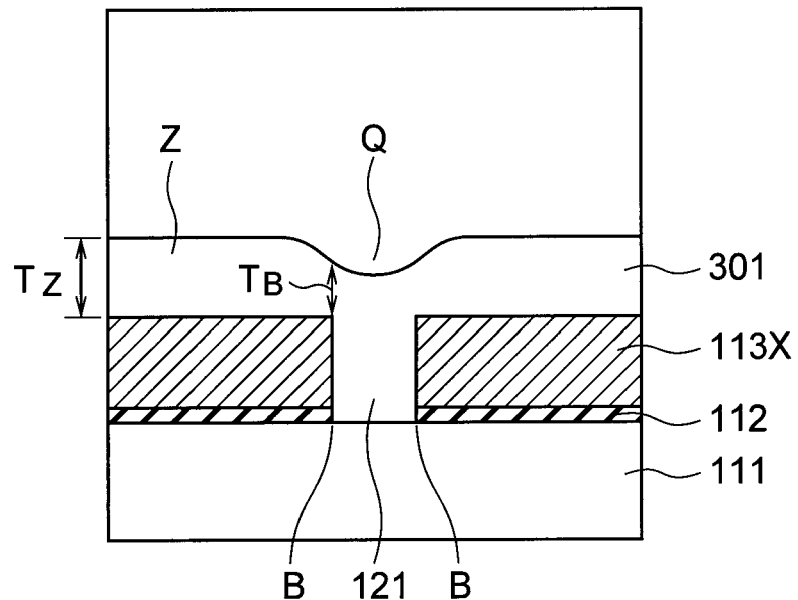
FIG. 7 shows a side sectional view for explaining a recess of a second BARC.

In FIG. 7, the outline of the hole 121 is indicated by "B", and a flat portion of the second BARC 301, which is sufficiently apart from the hole 121, is indicated by "Z". Further, in FIG. 7, the thickness of the second BARC 301 on the outline "B" is indicated by "$T_B$", and the thickness of the second BARC 301 in the flat portion "Z" is indicated by "$T_Z$". In the present embodiment, the thickness "$T_B$" on the outline "B" is made smaller than the thickness "$T_Z$" in the flat portion "Z", by 0% to 20% of the thickness "$T_Z$" (i.e., $0.8 \times T_Z < T_B < T_Z$). In the present embodiment, reduction of the thickness "$T_B$" is suppressed to 0% to 20% of the thickness "$T_Z$" to thereby avoid the above-mentioned disadvantage in the exposure. The thickness "$T_Z$" in the flat portion "Z", here, is 80 nm.

The diligent study of the inventors has also revealed that the thickness "$T_B$" on the outline "B" satisfying "$0.8 \times T_Z < T_B < T_Z$" can be realized by employing the hole 121 having the length "$\alpha$" of 400 nm or less and the length "$\beta$" of 70 nm or less.

Figure 8:
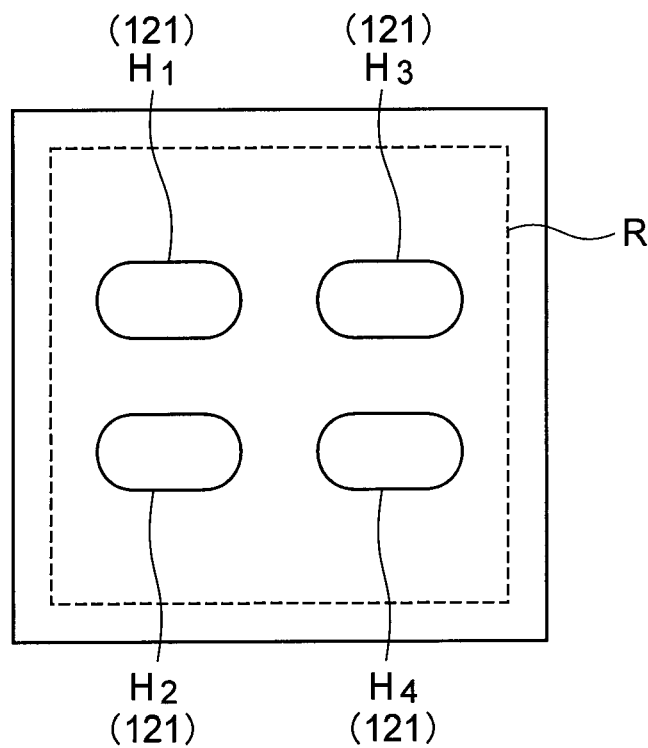
FIG. 8 shows a planar view for explaining an opening ratio of gate butt holes.

FIG. 8 shows a planar view for explaining an opening ratio of gate butt holes 121. The opening ratio of holes 121 is specified as a ratio of areas occupied by holes 121 in a predetermined region on the substrate 111. FIG. 8 shows the predetermined region indicated by "R" and four holes 121 indicated by $H_1$ to $H_4$. In this case, the opening ratio is calculated by dividing the total of the areas of the four holes $H_1$ to $H_4$ by the area of the predetermined region "R". In order to suppress the reduction in the thickness of the BARC around the hole 121, it is desirable in the present embodiment to set the opening ratio to 50% or less.

Figure 9:
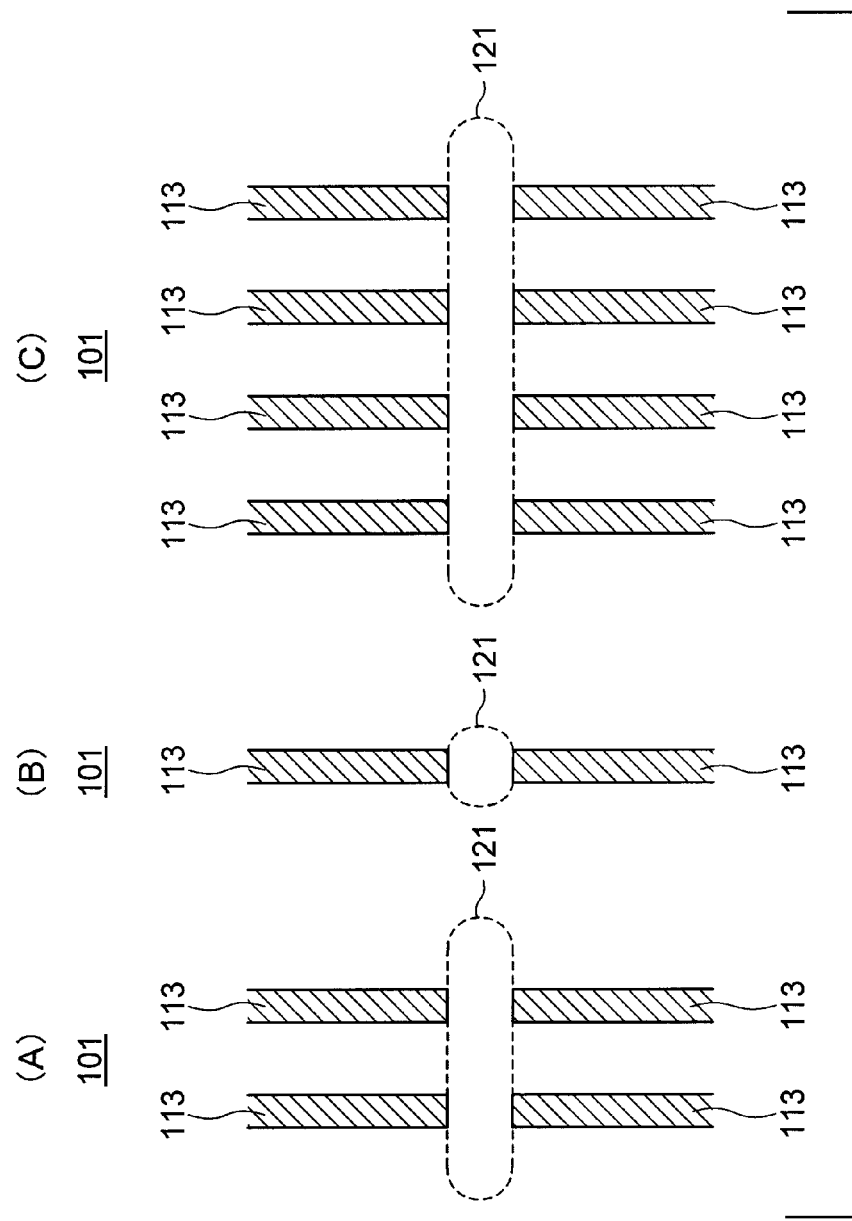
FIG. 9 shows planar views for explaining a gate butt hole.

FIG. 9 shows planar views for explaining the gate butt hole 121. In the present embodiment, as shown in FIG. 9(A), two pairs of gate electrodes 113 are formed using a single hole 121. Alternatively, as shown in FIG. 9(B), one pair of gate electrodes 113 may be formed using a single hole 121. Alternatively, as shown in FIG. 9(C), three or more pairs of gate electrodes 113 may be formed using a single hole 121.

Forming one pair of gate electrodes 113 using a single hole 121 is advantageous in that the size of the hole 121 can be reduced. On the other hand, forming three or more pairs of gate electrodes 113 using a single hole 121 is advantageous in that an exposure margin can be easily ensured. The present embodiment, in which two pairs of gate electrodes 113 are formed using a single hole 121, can gain the advantages of both of the cases.

In the case where one pair of gate electrodes 113 is formed using a single hole 121, the hole 121 may have a circular shape as shown in FIG. 9(B).

The present embodiment has been compared with the first and second comparative examples. As is understood from the above description, the present embodiment has various advantages comparing with the first and second comparative examples. In the present embodiment, the first comparative example, and the second comparative example, the gates can be trimmed at the stages shown in FIGS. 2(D), 3(B), and 4(B) respectively. Thereby, a gate length smaller than an exposure limit can be realized.

As described above, in the present embodiment, the gate etching is performed without using a hard mask, and the gate butt portions are fabricated prior to fabricating the MOS gates. Accordingly, the present embodiment can mitigate various problems involved in the use of the double exposure.

For example, in the present embodiment, an increase of the number of steps can be suppressed, so that an increase of a manufacturing cost of the semiconductor device 101 caused by the employment of the double exposure can be suppressed. Further, in the present embodiment, an increase of an adverse effect of post-processing caused by the employment of the double exposure can be suppressed. Further, when the double exposure is performed in the present embodiment, the anti-reflection coating for the second exposure can be comparatively easily formed.

Hereinafter, a method of manufacturing a semiconductor device 101 according to a second embodiment will be described. The second embodiment is a modification of the first embodiment. Therefore, the following description on the second embodiment will be focused on the points different from the first embodiment.

(Second Embodiment)

Figure 10:
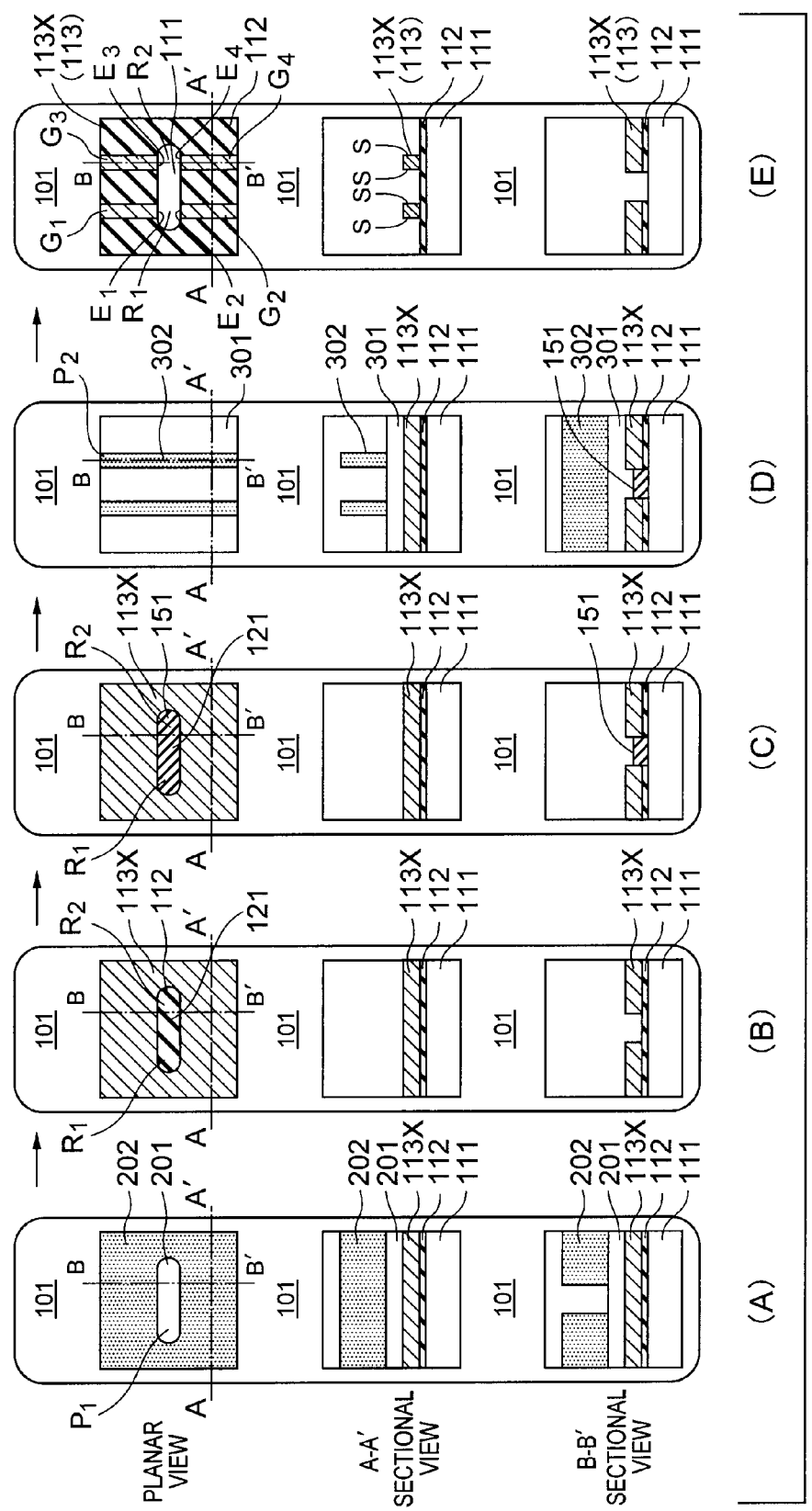
FIG. 10 is a step diagram illustrating a method of manufacturing a semiconductor device according to a second embodiment.

FIG. 10 is a step diagram illustrating a method of manufacturing a semiconductor device 101 according to a second embodiment. In FIG. 10, steps of the manufacturing method are illustrated in FIGS. 10(A) to 10(E). The steps illustrated in FIGS. 10(A) to 10(E) are shown in the order of procedure of the manufacturing method. Also, similar to FIG. 1 and FIGS. 2(A) to 2(D), each of FIGS. 10(A) to 10(E) shows a planar view on the top, an A-A' sectional view in the middle, and a B-B' sectional view at the bottom. Details of FIGS. 10(A) to 10(E) will be explained after explaining FIGS. 11 to 13.

Figure 11:
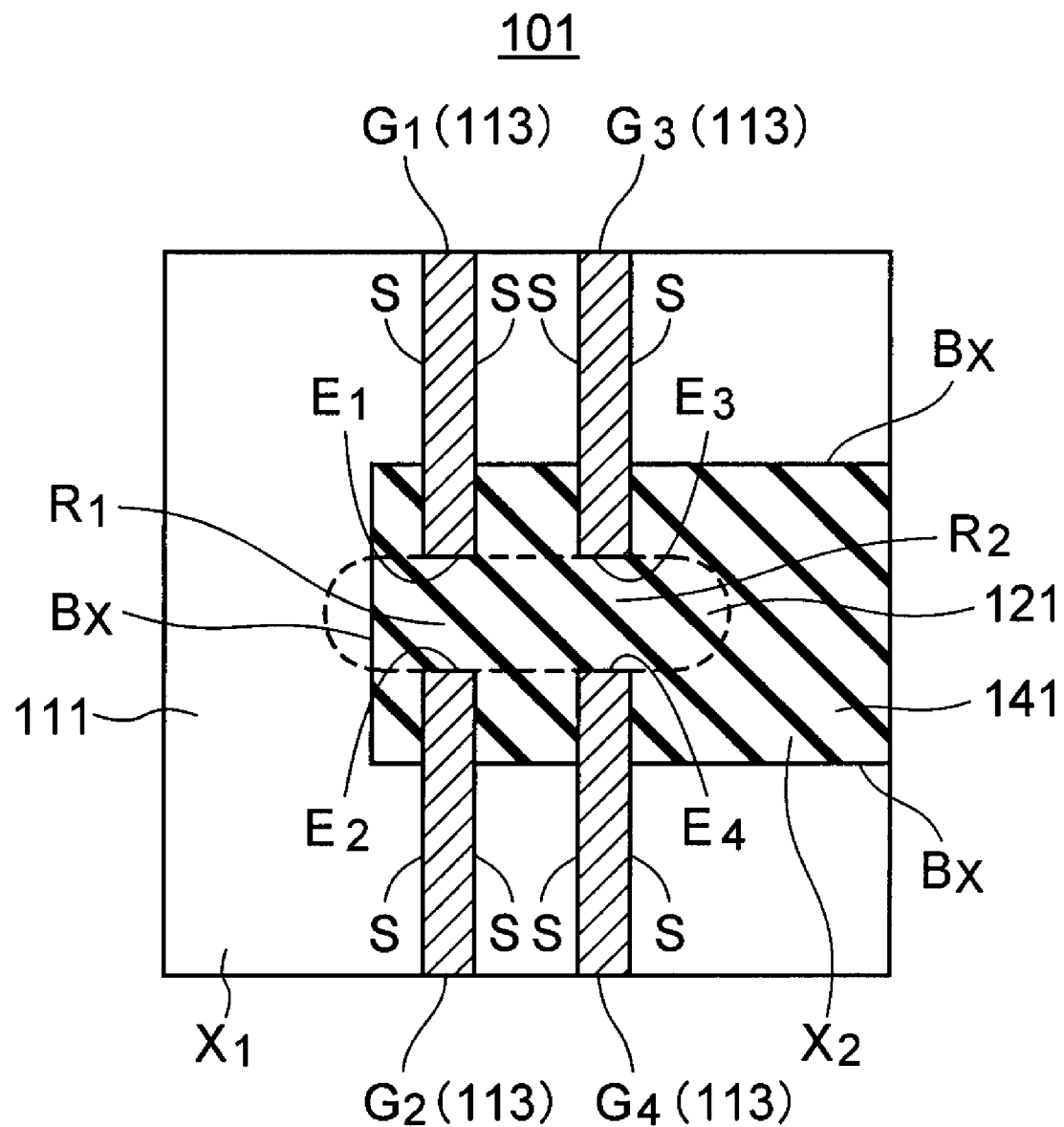
FIG. 11 shows a planar view for explaining a boundary between an element region and an isolation region.

As shown in FIG. 5, the gate butt hole 121 in the first embodiment is formed inside the isolation region $X_2$. On the other hand, as shown in FIG. 11, a gate butt hole 121 in the second embodiment is formed on a boundary between an element region $X_1$ and an isolation region $X_2$. In FIG. 11, each boundary between the element region $X_1$ and the isolation region $X_2$ is indicated by "$B_X$".

Figure 12:
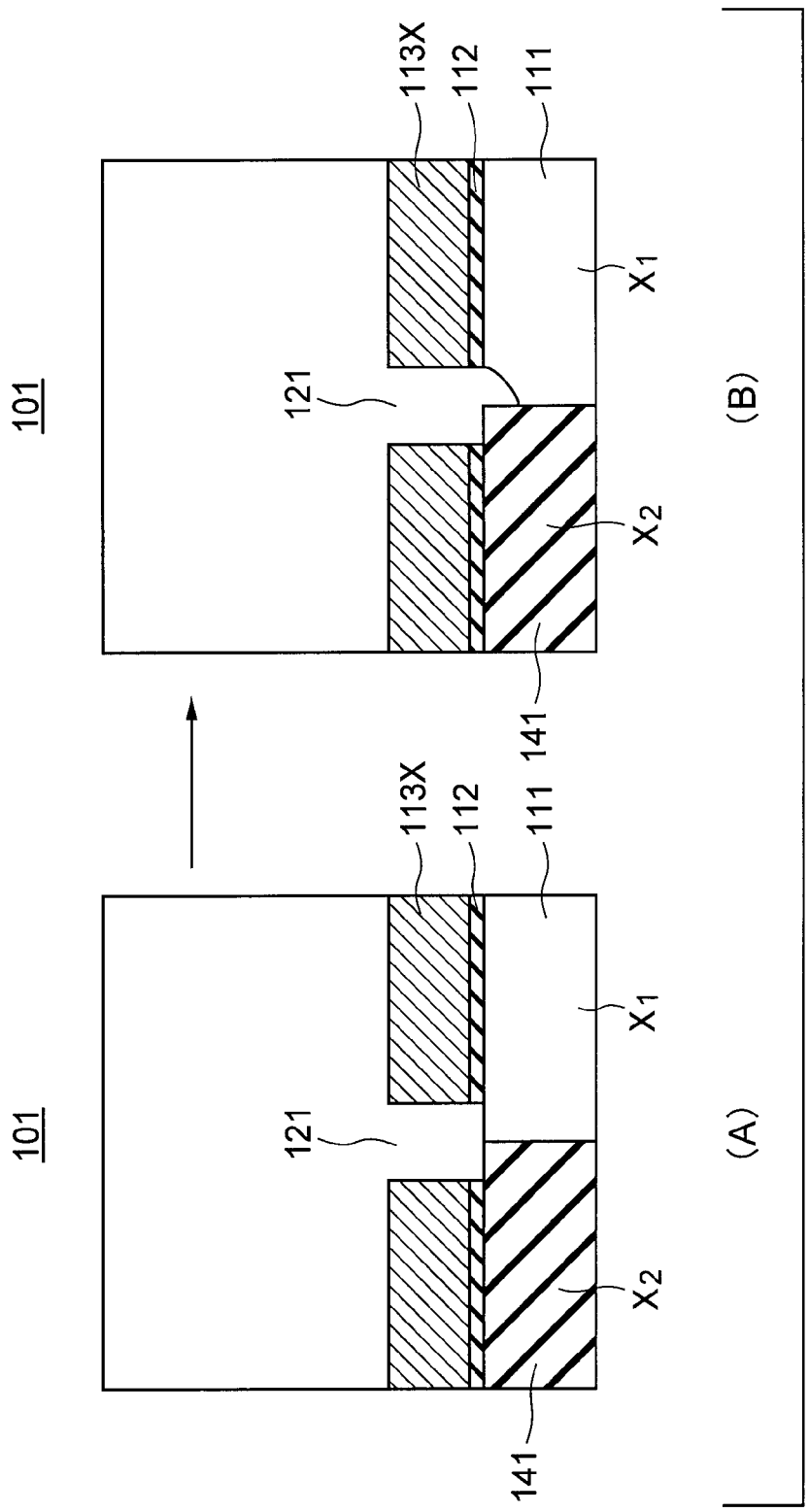
FIG. 12 shows side sectional views for explaining a problem in the second embodiment.
Figure 13:
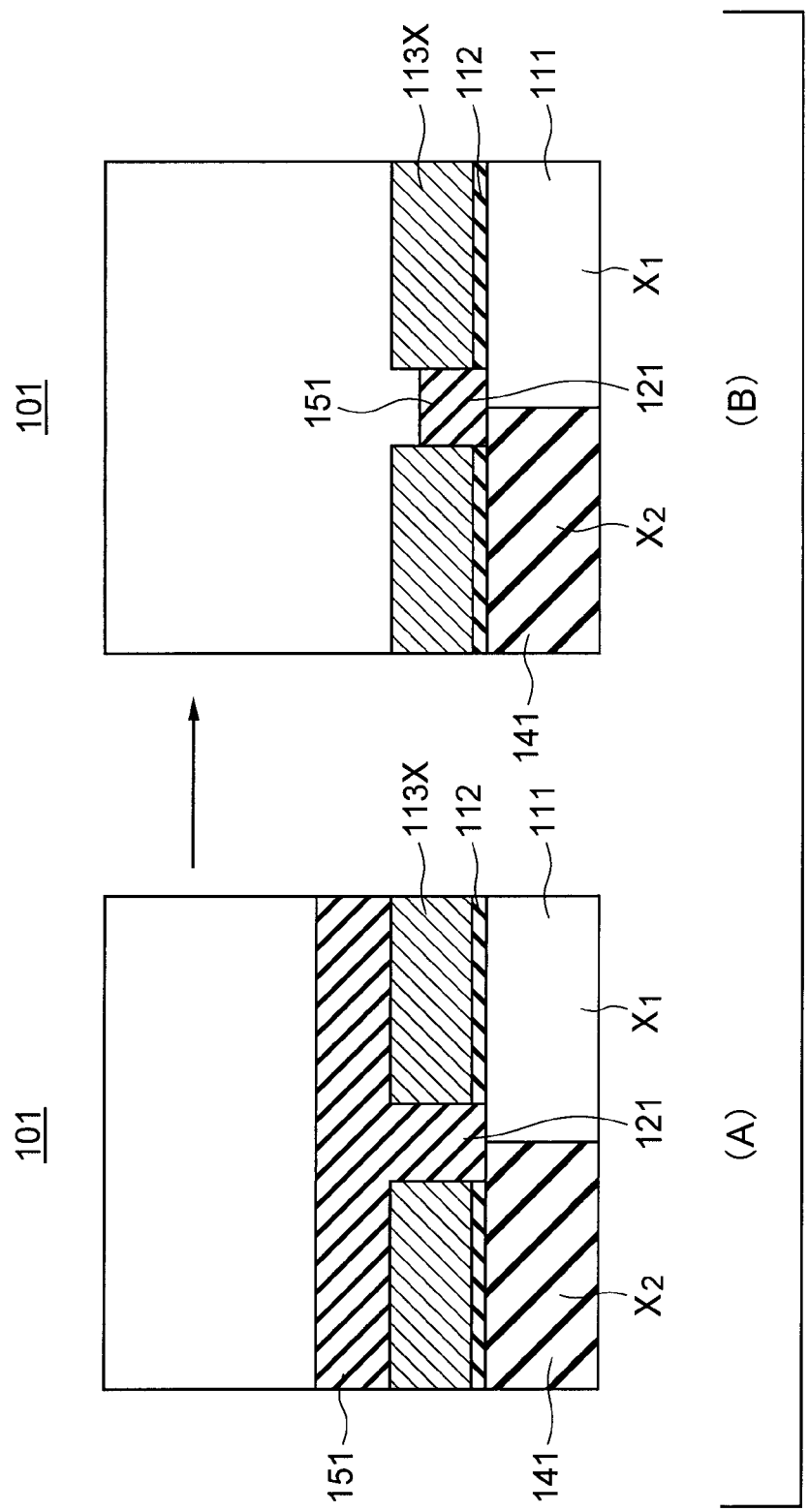
FIG. 13 shows side sectional views for explaining a resolution for the problem in the second embodiment.

FIG. 12 shows side sectional views for explaining a problem in the second embodiment. FIG. 13 shows side sectional views for explaining a resolution for the problem in the second embodiment.

In the manufacturing method of the present embodiment shown in FIG. 10, steps of FIGS. 10(A) and 10(B) are performed in a manner similar to that of the steps of FIGS. 2(A) and 2(B). However, as mentioned above, the gate butt hole 121 in the present embodiment is formed on the boundary "$B_X$" between the element region $X_1$ and the isolation region $X_2$. Therefore, in the present embodiment, as shown in FIG. 12(A), the element region $X_1$ and the isolation region $X_2$ are exposed to the bottom of the hole 121 by performing the step of FIG. 10(B). After that, a second BARC 301 is formed on the bottom of the hole 121. Further, in fabricating MOS gates, the second BARC 301 is removed from the bottom of the hole 121. However in this case, at the bottom of the hole 121, a substrate 111 in the element region $X_1$ is likely to be cut away, as shown in FIG. 12(B). Such cutting of the substrate 111 may not be preferable in terms of the characteristics of the device, and may be the cause of reducing the thickness of the second BARC 301.

Therefore, in the present embodiment, as shown in FIG. 13(A), an oxide layer 151 is applied on a gate electrode layer 113X where the hole 121 has been formed, before forming the second BARC 301. Then, the oxide layer 151 is etched back using fluorinated acid. As a result, as shown in FIG. 13(B), the oxide layer 151 is embedded in the hole 121. After that, in the present embodiment, the second BARC 301 is formed on the gate electrode layer 113X in which the oxide layer 151 has been embedded. As a result, the cut in the substrate 111 as shown in FIG. 12(B) can be prevented in the present embodiment.

The oxide layer 151, here, is a silicon oxide layer called SOG (Spin On Glass) layer. However, other oxide layers formed by application may be used as the oxide layer 151. Also, the oxide layer 151 embedded in the hole 121 may have any thickness, if only the height of the top surface of the oxide layer 151 is equal to or lower than that of the top surface of the gate electrode layer 113X. The oxide layer 151 is an example of an insulating layer of the present invention.

Hereinafter, the method of manufacturing the semiconductor device 101 in the present embodiment will be described with reference to FIGS. 10(A) to 10(E).

First, the steps of FIGS. 10(A) and 10(B) are carried out in a manner similar to that of the steps of FIGS. 2(A) and 2(B). Thereby, the hole 121 passing through the gate electrode layer 113X is formed in the gate electrode 113X. Then, as shown in FIG. 10(C), the oxide layer 151 is applied on the gate electrode layer 113X in which the hole 121 has been formed, so that the oxide layer 151 is embedded in the hole 121. Then, steps of FIGS. 10(D) and 10(E) are carried out in a manner similar to that of the steps of FIGS. 2(C) and 2(D). As a result, the gate structure shown in FIG. 1 is realized.

It should be noted that, for simplifying explanation, FIG. 10 omits illustration of an isolation layer 141.

As described above, the present embodiment can prevent the substrate 111 at the bottom of the gate butt hole 121 from being cut, in the case where the hole 121 is formed on the boundary between the element region and the isolation region.

The present embodiment is advantageous in forming three or more pairs of gate electrodes 113 using a single hole 121, as shown in FIG. 9(C). In this case, since the size of the hole 121 is large, it is usually difficult to form the hole 121 so as not to be extended into the element region. In this case, use of the manufacturing method according to the present embodiment can prevent the cutting of the substrate 111 as described above, while the hole 121 is formed being extended into the element region.

Figure 14:
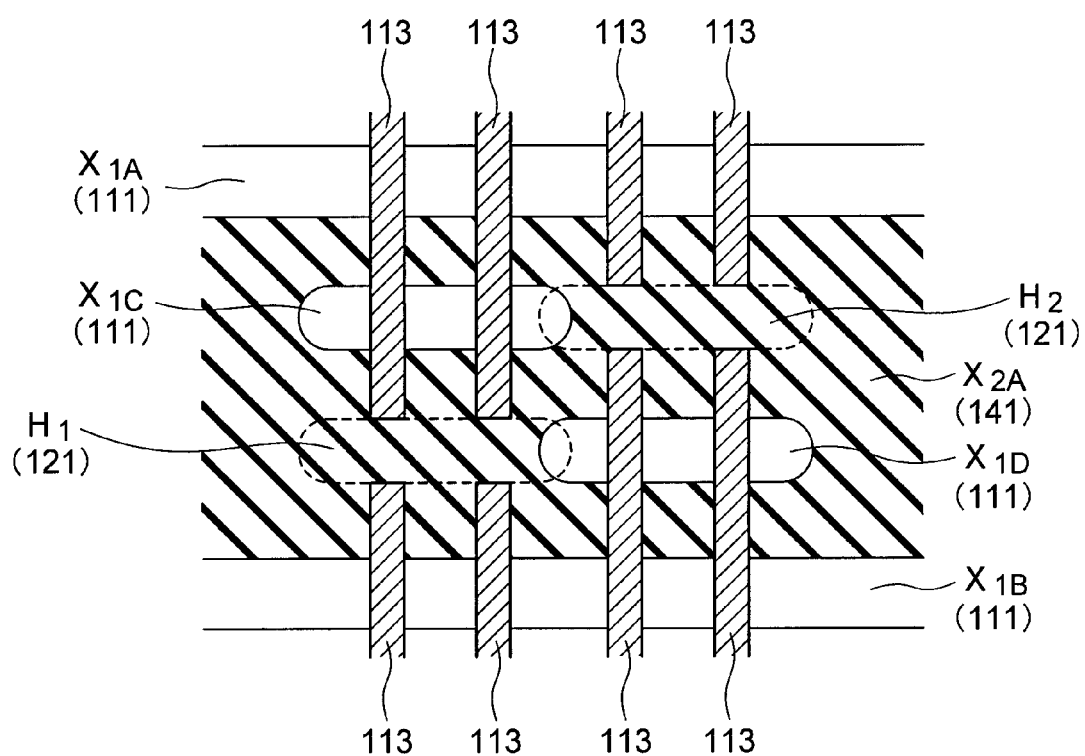
FIG. 14 shows a planar view illustrating a first example of a configuration of the semiconductor device according to the second embodiment.

The present embodiment may be employed, for example, in manufacturing a semiconductor device 101 having the following circuit configuration. FIG. 14 shows a planar view illustrating a first example of a configuration of the semiconductor device 101, and FIG. 15 shows a planar view illustrating a second example of a configuration of the semiconductor device 101.

The first example shown in FIG. 14 corresponds to a circuit pattern of an SRAM. In FIG. 14, strip-shaped element regions $X_{1A}$ and $X_{1B}$, and island-shaped element regions $X_{1C}$ and $X_{1D}$ surrounded by an isolation region $X_{2A}$ exist on a substrate 111. In FIG. 14, four pairs of gate electrodes 113 are formed using holes 121 indicated by $H_1$ and $H_2$. In this case, the holes 121 indicated by $H_1$ and $H_2$ overlap with the island-shaped element regions $X_{1C}$ and $X_{1D}$ respectively. Accordingly, in this case, the manufacturing method according to the second embodiment may be appropriately used.

Figure 15:
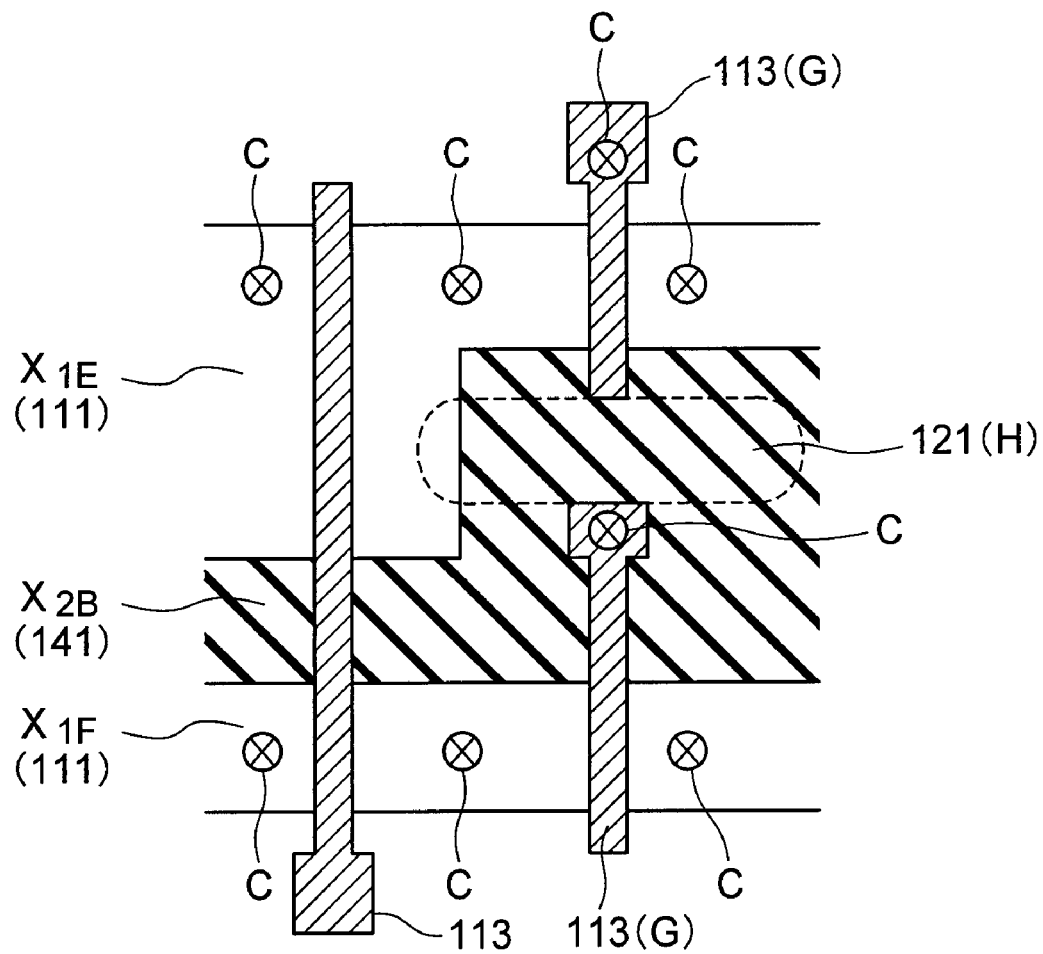
FIG. 15 shows a planar view illustrating a second example of a configuration of the semiconductor device according to the second embodiment.

The second example shown in FIG. 15 corresponds to a contact pattern. In FIG. 15, element regions $X_{1E}$ and $X_{1F}$ located adjacent to an isolation region $X_{2B}$ exist on a substrate 111. FIG. 15 further shows positions "C" at which contact plugs are to be formed. In FIG. 15, a pair of gate electrodes 113 is formed from a gate electrode layer 113X indicated by "G", using the hole 121 indicated by "H". In this case, the hole 121 indicated by "H" overlaps with the element region $X_{1E}$. Accordingly, in this case, the manufacturing method according to the second embodiment may be appropriately used.

As described above, in the present embodiment, the gate etching is performed without using a hard mask, and the gate butt portions are fabricated prior to fabricating the MOS gates, as in the first embodiment. Accordingly, as in the first embodiment, the present embodiment can mitigate various problems involved in the use of the double exposure.

Further, in the present embodiment, an oxide layer is embedded in the gate butt hole between fabricating the gate butt portions and fabricating the MOS gates. As a result, the present embodiment can prevent cutting of the substrate at the bottom of the gate butt hole, in the case where the gate butt hole is formed on the boundary between the element region and the isolation region.

As described above, the embodiments of the present invention can provide a method of manufacturing a semiconductor device, which can mitigate the problems such as an increase of the number of steps and the like, caused in the gate etching by exposure for plural times.

Although specific examples of aspects of the present invention have been described by the first and second embodiments, the present invention is not limited to these embodiments.

The invention claimed is:

1. A method of manufacturing a semiconductor device, for forming at least one pair of gate electrodes having end portions opposed to each other across a gap, the method comprising:
    forming an isolation layer on a substrate to form an element region and an isolation region on the substrate;
    forming a gate insulator and a gate electrode layer on the substrate on which the isolation layer has been formed, in order;
    forming a first anti-reflection coating and a first resist on the gate electrode layer in order;
    exposing and developing the first resist;
    etching the gate electrode layer by using the first resist or the first anti-reflection coating as a mask, to remove the gate electrode layer from a region for forming the gap, thereby forming a hole penetrating the gate electrode layer in the isolation region to expose the gate insulator in the hole;
    forming a second anti-reflection coating and a second resist on the gate electrode layer where the hole has been formed, in order;
    exposing and developing the second resist; and
    etching the gate electrode layer by using the second resist or the second anti-reflection coating as a mask, to form the at least one pair of gate electrodes having the end portions opposed to each other across the gap, from the gate electrode layer.

2. The method according to claim 1, wherein
a thickness of the second anti-reflection coating on an outline of the hole is smaller than a thickness of a flat portion of the second anti-reflection coating, by 0% to 20% of the thickness of the flat portion.

3. The method according to claim 1, wherein
the gate electrode layer is subjected to post-processing, after etching the gate electrode layer using the first resist or the first anti-reflection coating as the mask, and after etching the gate electrode layer using the second resist or the second anti-reflection coating as the mask.

4. The method according to claim 1, wherein the hole has a shape of an ellipse.

5. The method according to claim 4, wherein a major axis of the ellipse has a length of 400 nm or less, and a minor axis of the ellipse has a length of 70 nm or less.

6. The method according to claim 4, wherein two or more pairs of the gate electrodes are formed using the hole.

7. The method according to claim 1, wherein the hole has a circular shape.

8. The method according to claim 7, wherein one pair of the gate electrodes is formed using the hole.

9. The method according to claim 1, wherein a ratio of an area occupied by the hole in a predetermined region on the substrate is 50% or less.

10. A method of manufacturing a semiconductor device, for forming at least one pair of gate electrodes having end portions opposed to each other across a gap, the method comprising:
    forming an isolation layer on a substrate to form an element region and an isolation region on the substrate;
    forming a gate insulator and a gate electrode layer on the substrate on which the isolation layer has been formed, in order;
    forming a first anti-reflection coating and a first resist on the gate electrode layer in order;
    exposing and developing the first resist;
    etching the gate electrode layer by using the first resist or the first anti-reflection coating as a mask, to remove the gate electrode layer from a region for forming the gap, thereby forming a hole penetrating the gate electrode layer on a boundary between the element region and the isolation region;
    embedding an insulating layer in the hole;
    forming a second anti-reflection coating and a second resist on the gate electrode layer where the insulating layer has been embedded, in order;
    exposing and developing the second resist; and
    etching the gate electrode layer by using the second resist or the second anti-reflection coating as a mask, to form the at least one pair of gate electrodes having the end portions opposed to each other across the gap, from the gate electrode layer.

11. The method according to claim 10, wherein
the gate electrode layer is subjected to post-processing, after etching the gate electrode layer using the first resist or the first anti-reflection coating as the mask, and after etching the gate electrode layer using the second resist or the second anti-reflection coating as the mask.

12. The method according to claim 10, wherein
a height of a top surface of the insulating layer is set to be equal to or lower than a height of a top surface of the gate electrode layer.

13. The method according to claim 10, wherein
the insulating layer is an oxide layer, and
the oxide layer is embedded in the hole by coating the oxide layer on the gate electrode layer in which the hole has been formed, and etching back the oxide layer, using fluorinated acid.

14. The method according to claim 13, wherein the oxide layer is an SOG (Spin On Glass) layer.

15. The method according to claim 10, wherein the hole has a shape of an ellipse.

16. The method according to claim 15, wherein a major axis of the ellipse has a length of 400 nm or less, and a minor axis of the ellipse has a length of 70 nm or less.

17. The method according to claim 10, wherein the hole has a circular shape.

18. The method according to claim 10, wherein the element region has a shape of an island surrounded by the isolation region.

* * * * *